(12) United States Patent
Kondo et al.

(10) Patent No.: US 10,237,991 B2
(45) Date of Patent: Mar. 19, 2019

(54) ELECTRONIC COMPONENT

(71) Applicant: Molex, LLC, Lisle, IL (US)

(72) Inventors: Nobuyuki Kondo, Yamato (JP);
Toshihiro Niitsu, Machida (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/801,658

(22) Filed: Nov. 2, 2017

(65) Prior Publication Data

US 2018/0153045 A1 May 31, 2018

(30) Foreign Application Priority Data

Nov. 29, 2016 (JP) .................................. 2016-230718

(51) Int. Cl.
| | | |
|---|---|---|
| *H01L 23/00* | (2006.01) | |
| *H05K 5/00* | (2006.01) | |
| *H05K 5/02* | (2006.01) | |
| *H01G 2/00* | (2006.01) | |
| *H01L 49/02* | (2006.01) | |

(52) U.S. Cl.
CPC ............. *H05K 5/0091* (2013.01); *H01G 2/00* (2013.01); *H01L 23/00* (2013.01); *H01L 28/40* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 3,381,372 A | * | 5/1968 | Capano ................... | H01L 21/50 174/541 |
| 3,784,884 A | * | 1/1974 | Zoroglu .................. | H01L 23/66 257/664 |
| 3,946,428 A | * | 3/1976 | Anazawa .............. | H01L 23/047 257/664 |
| 4,167,647 A | * | 9/1979 | Salera ................... | H01L 23/057 174/527 |
| 4,412,093 A | * | 10/1983 | Wildeboer ............ | H01L 23/047 174/527 |
| 4,504,887 A | * | 3/1985 | Bakermans .......... | H05K 7/1069 174/559 |
| 4,547,624 A | * | 10/1985 | Tower ..................... | H01L 23/10 174/50.56 |
| 4,594,613 A | * | 6/1986 | Shinbori ........... | H01L 27/14618 250/208.1 |
| 4,649,416 A | * | 3/1987 | Borkowski ............ | H01L 23/66 174/520 |
| 4,763,223 A | * | 8/1988 | Tang ................. | H01L 23/49811 174/555 |
| 5,032,691 A | * | 7/1991 | Kaufman ................ | H01L 21/50 174/559 |

(Continued)

FOREIGN PATENT DOCUMENTS

| | | |
|---|---|---|
| JP | H03-024271 U | 3/1991 |
| JP | H05-291320 A | 11/1993 |
| JP | H07-085910 A | 3/1995 |

*Primary Examiner* — Xanthia C Cunningham
(74) *Attorney, Agent, or Firm* — Molex, LLC (57) ABSTRACT

An electronic component is provided with a housing, a conductive terminal loaded on the housing, and an external conductive member loaded on the housing. A gap between the external conductive member and the conductive terminal is defined by a protrusion formed on the housing or the external conductive member.

23 Claims, 10 Drawing Sheets

(56) References Cited

U.S. PATENT DOCUMENTS

| | | | | |
|---|---|---|---|---|
| 5,109,268 | A * | 4/1992 | Butera | H01L 23/3731 257/705 |
| 5,214,498 | A * | 5/1993 | Lehman | H01L 23/66 257/678 |
| 5,247,134 | A * | 9/1993 | Beltz | H01L 21/50 174/527 |
| 5,504,372 | A * | 4/1996 | Braden | H01L 23/057 257/706 |
| 5,528,079 | A * | 6/1996 | McIver | H01L 23/057 257/698 |
| 5,792,984 | A * | 8/1998 | Bloom | H01L 23/10 174/536 |
| 6,049,127 | A * | 4/2000 | Yoo | H01L 23/10 257/704 |
| 6,072,240 | A * | 6/2000 | Kimura | H01L 25/072 257/692 |
| 6,191,838 | B1 * | 2/2001 | Muramatsu | H05K 3/365 349/149 |
| 6,242,694 | B1 * | 6/2001 | Muraki | H05K 5/0095 174/551 |
| 6,262,362 | B1 * | 7/2001 | Czjakowski | H01L 23/055 174/360 |
| 6,703,703 | B2 * | 3/2004 | Grant | H02M 7/003 257/680 |
| 6,716,677 | B2 * | 4/2004 | Ammar | H01L 23/492 361/707 |
| 6,729,888 | B2 * | 5/2004 | Imaeda | G02F 1/13452 439/66 |
| 6,852,927 | B2 * | 2/2005 | Fukushima | H01L 23/055 174/551 |
| 7,105,924 | B2 * | 9/2006 | Choudhury | H01L 23/04 257/678 |
| 7,626,672 | B2 * | 12/2009 | Song | G02F 1/13452 349/150 |
| 7,957,135 | B2 * | 6/2011 | Ohkouchi | H01L 25/18 165/104.33 |
| 9,907,199 | B2 * | 2/2018 | Wu | H05K 7/1023 |
| 2006/0068640 | A1 | 3/2006 | Gailus | |
| 2015/0181728 | A1 * | 6/2015 | Tanaka | H01L 23/057 361/820 |
| 2016/0343628 | A1 * | 11/2016 | Kawazu | H01L 23/057 |

* cited by examiner

ELECTRONIC COMPONENT

RELATED APPLICATIONS

This application claims priority to Japanese Application No. 2016-230718, filed Nov. 29, 2016, which is incorporated herein by reference in its entirety.

TECHNICAL FIELD

The present disclosure relates to an electronic component.

BACKGROUND ART

Conventionally, a chip-like electronic component including various elements such as a resistor is mounted on a substrate such as a printed circuit board (for example, see patent literature 1).

Figure 10A:
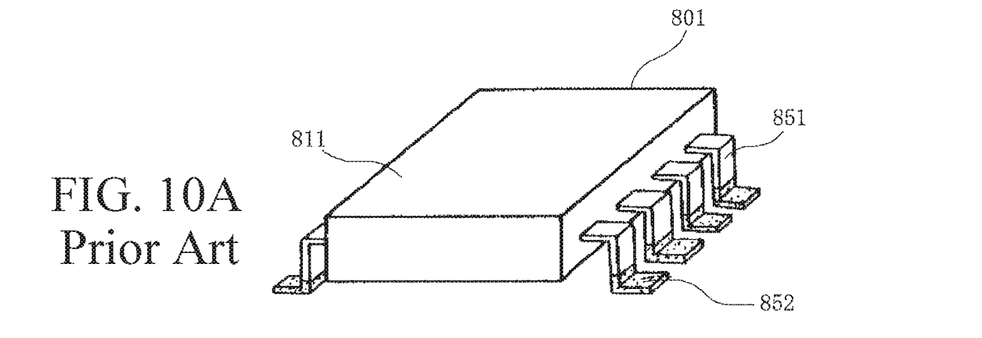
FIG. 10A is a perspective view of the electronic component.
Figure 10B:
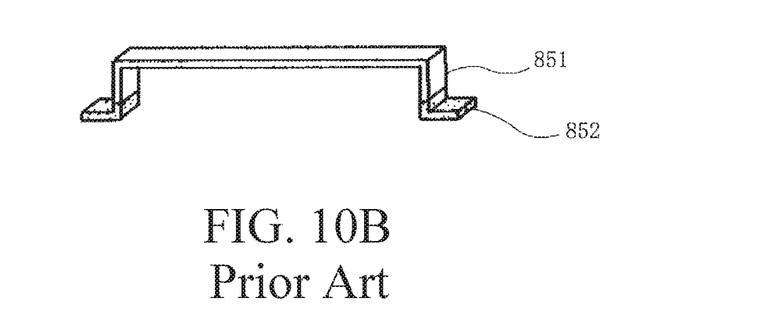
FIG. 10B is a perspective view of a conductive plate.

FIGS. 10A and 10B are diagrams illustrating a conventional electronic component. Note, in the drawing, FIG. 10A is a perspective view of an electronic component, and FIG. 10B is a perspective view of a conductive plate.

In the drawing, 801 is a jumper chip which is one type of an electronic component, and is mounted on the surface of a substrate, not illustrated. The jumper chip 801 is provided with a plurality of conductive plates 851, and a housing 811 for enclosing and sealing a portion near the center of the conductive plates 851.

Each conductive plate 851 is an elongated plate member composed of a conductive metal such as a copper alloy, and is provided with an L-shaped attachment end part 852 on both ends as illustrated in the drawing. Then, the plurality of conductive plates 851 (four in the example illustrated in the drawing) are arranged side by side so as to be parallel to each other. Furthermore, the housing 811 is composed of an insulative resin material, and holds and fixes the conductive plates 851, which are arranged side by side.

Then, the jumper chip 801 is mounted on the surface of a substrate by each attachment end part 852 being fixed to a conductive wire formed on the surface of the substrate, not illustrated, by means such as soldering and the like.

Patent Literature 1: Japanese Utility Model H3-024271

SUMMARY

However, in the conventional electronic component, the conductive plates 851 are held by the housing 811, but since the housing 811 only fixes a resin to form a predetermined shape, it is difficult to strictly keep the gap between adjacent conductive plates 851 to a predetermined size, and is also difficult to attach a shield plate to the conductive plates 851 to maintain a predetermined gap therebetween. In recent years, as various electrical devices and electronic devices have begun to be miniaturized, electronic components implemented on a substrate mounted on an electrical device and an electronic device have also begun to be miniaturized, but even in the case of an electronic component having a simple structure such as the jumper chip 801, when miniaturized, since it becomes difficult to strictly manage the dimensions of the housing 811 formed by solidifying the resin, it becomes further difficult to strictly maintain the gap between adjacent conductive plates 851, and the gap between the shield plate and the conductive plate 851 to a predetermined minute dimension.

Here, it is an object of the present invention to solve the conventional problems described previously by providing an electronic component that can reliably maintain the gap between each adjacent conductive member to a predetermined dimension even when miniaturized, and to reliably exhibit a desired performance, have a high reliability, low manufacture cost, and a high durability.

Therefore, in an electronic component provided with a housing, a conductive terminal loaded on the housing, and an external conductive member loaded on the housing, wherein the gap between the external conductive member and the conductive terminal is defined by a protrusion formed on the housing or the external conductive member.

In another electronic component, the housing is a flat plate member integrally formed with the conductive terminal, and the external conductive member is loaded on both sides of the flat plate housing.

Further, in another electronic component, a thin film-like insulator is provided on a surface of the external conductive member facing the conductive terminal.

Further, in another electronic component, a second gap smaller than the gap exists between the insulator and the conductive terminal.

Further, in another electronic component, the housing includes a flat plate part provided on a surface substantially flush with the surface of the conductive terminal, and a protrusion formed on both ends of the flat part protruding from the surface of the flat part; and the external conductive member includes a flat surface part disposed on both ends, wherein the flat surface part contacts the surface of the protrusion, whereby the gap is defined.

Further, in another electronic component, the housing is a flat plate part having a surface substantially flush with the surface of the conductive terminal, where both ends also include a flat plate part flush with the other portion, and the external conductive member includes a protrusion formed on both ends, wherein the protrusion contacts both ends of the flat plate part, whereby the gap is defined.

Further, in another external conductive member, the conductive terminal is provided in plurality, and the external conductive member includes a protrusion that conducts by contacting the surface of at least one conductive terminal, whereby the gap is defined.

Further, in another electronic component, the housing includes a flat plate part provided on a surface substantially flush with the surface of the conductive terminal, and a frame part thicker than the flat plate part, which is a frame part that defines the periphery of the flat plate part, and the external surface of the external conductive member loaded on the housing is substantially flush with the surface of the frame part.

According to the present disclosure, even when the electronic component is miniaturized, the gap between each adjacent conductive member can be reliably maintained at a predetermined dimension, and a desired performance can be exhibited, wherein the reliability is high, the manufacturing cost is reduced, and the durability is improved.

BRIEF DESCRIPTION OF THE DRAWINGS

FIGS. 5A and 5B are cross-sectional views of the electronic component according to the first embodiment, FIG.

5A is cross-sectional view along the A-A line in FIG. 1.

FIGS. 9A and 9B are cross-sectional views of the electronic component according to the second embodiment.

FIGS. 10A and 10B are diagrams illustrating a conventional electronic component.

DETAILED DESCRIPTION OF THE PREFERRED EMBODIMENTS

Embodiments will be described in detail below with reference to drawings.

Figure 1:
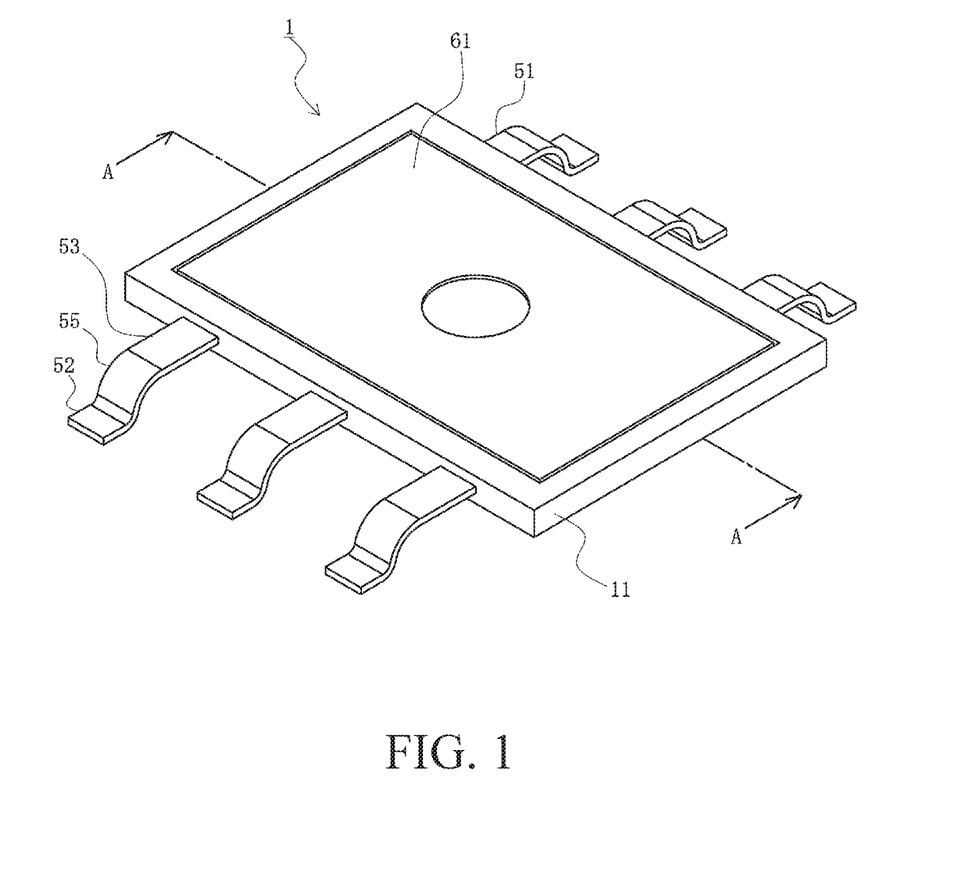
FIG. 1 is a perspective view illustrating the electronic component according to the first embodiment.
Figure 2:
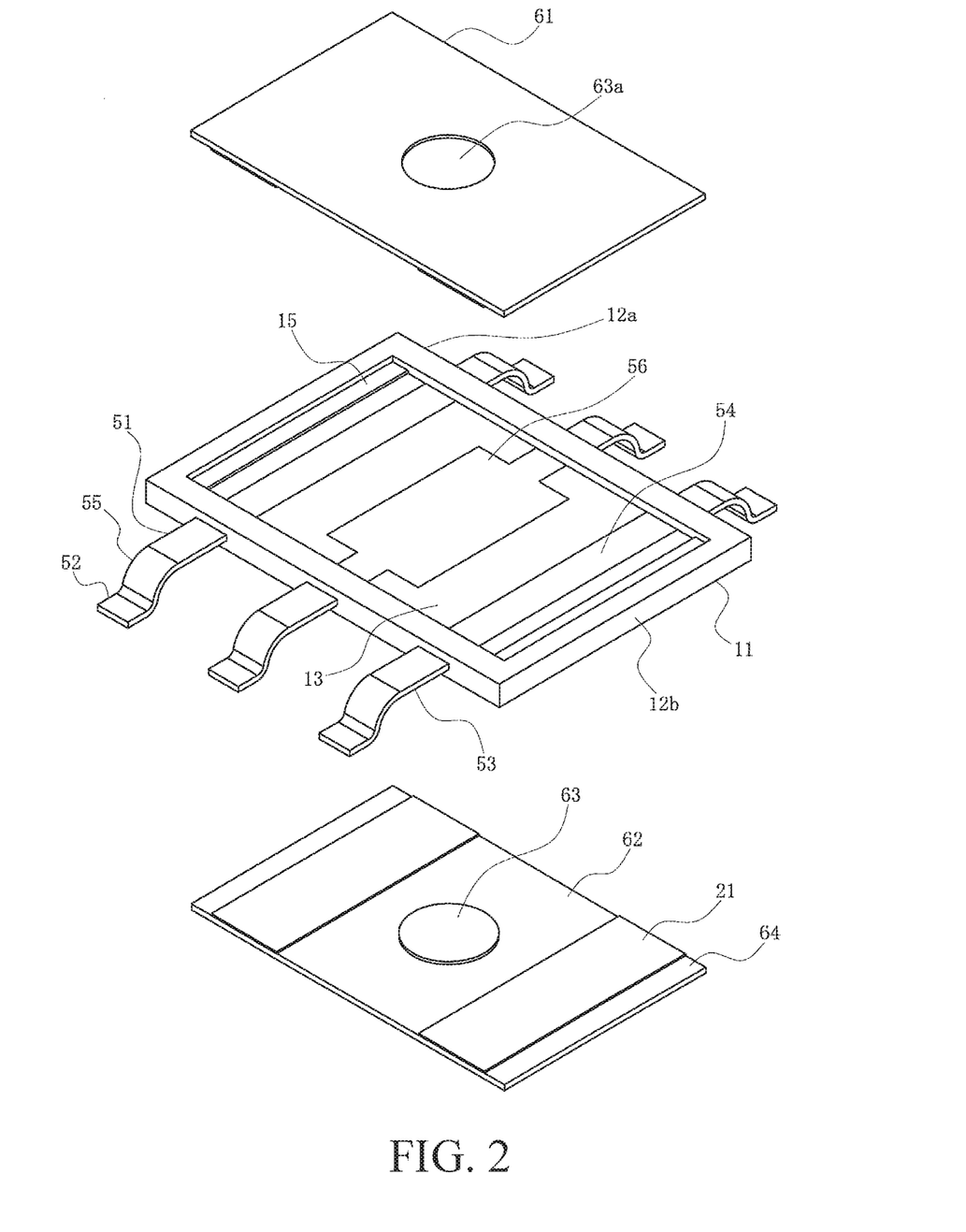
FIG. 2 is an exploded view of the electronic component according to the first embodiment.
Figure 3:
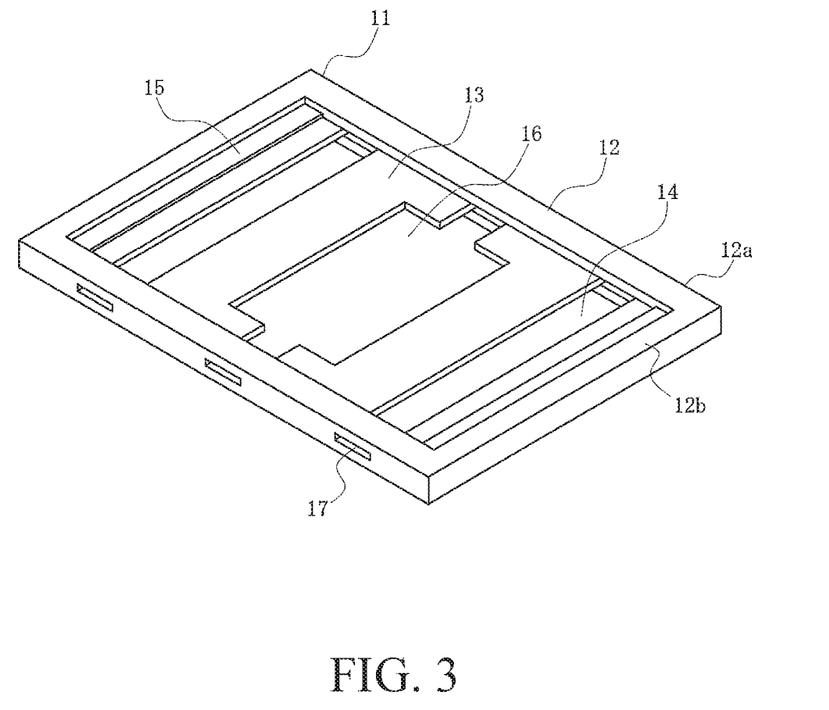
FIG. 3 is a perspective view illustrating the housing according to the first embodiment.
Figure 4:
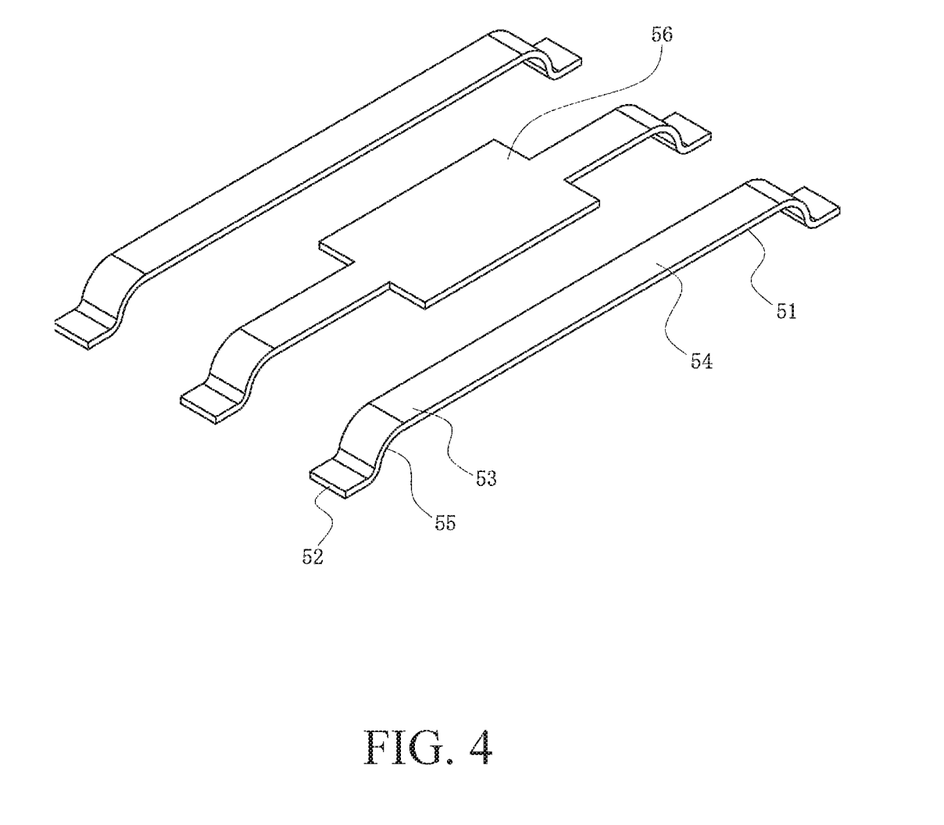
FIG. 4 is a perspective view illustrating the conductive member according to the first embodiment.
Figure 5A:
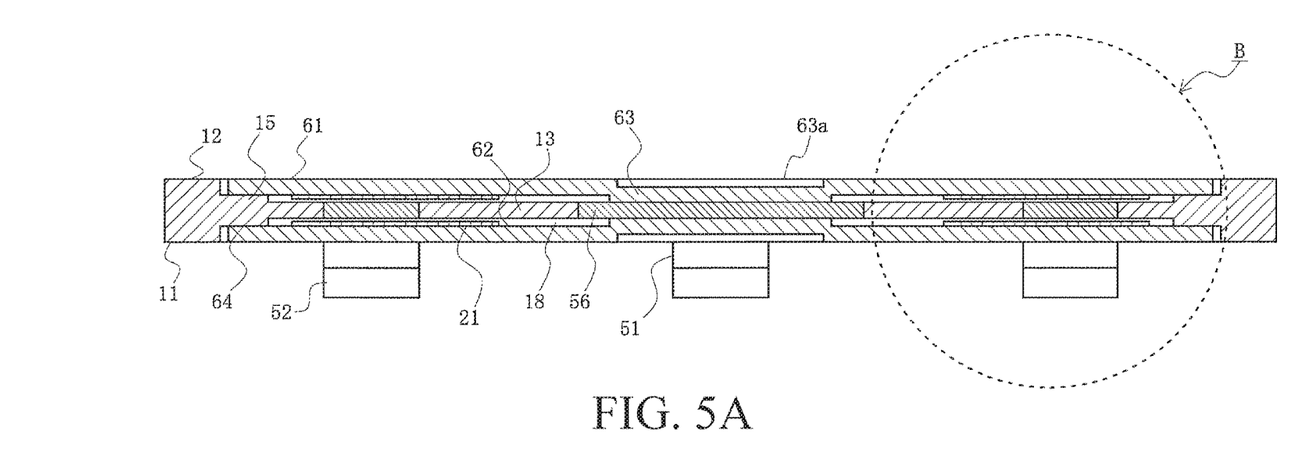
Figure 5B:
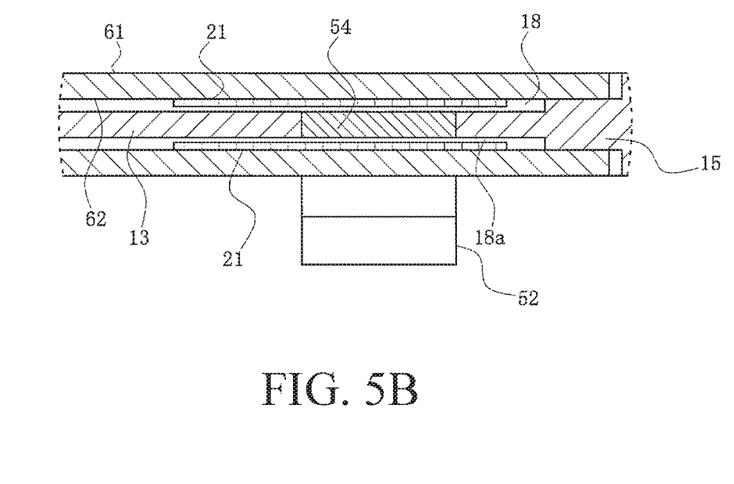
FIG. 5B is an enlarged view of portion B in FIG. 5A.

FIG. 1 is a perspective view illustrating the electronic component according to the first embodiment, FIG. 2 is an exploded view of the electronic component according to the first embodiment, FIG. 3 is a perspective view illustrating the housing according to the first embodiment, FIG. 4 is a perspective view illustrating the conductive member according to the first embodiment, FIGS. 5A and 5B are cross-sectional views of the electronic component according to the first embodiment. Note, FIG. 5A is a cross-sectional view along the A-A line in FIG. 1, and FIG. 5B is an enlarged view of the portion B in FIG. 5A.

In the drawings, 1 is the electronic component according to the first embodiment, and is, for example, a jumper chip provided with a plurality of jumper wires, but may also be a chip type resistance network including resistors, and may be a variety of objects, but here it is described as a chip type electronic component provided with a housing 11 and a plurality of conductive terminals 51 loaded on the housing 11. Furthermore, the electronic component 1 may be used in a variety of equipment and devices and the like such as fabrication electronics and electronic equipment, household electronics and electronic appliances, computers, and transmission equipment; but here, for convenience of description, it is assumed that it is mounted on the surface of a substrate such as a printed circuit board used in electronic equipment and the like, a flexible flat cable (FFC), a flexible circuit board (FPC), and the like.

Note, in the present embodiment, expressions indicating the directions such as up, down, left, right, front, and back that are used to describe the configuration and operation of each part included in the electronic component 1 are relative and not absolute, and they are suitable when each part included in the electronic component 1 is in the position illustrated by the drawings; however, when the position of each part included in the electronic component 1 is changed, then they should be interpreted with changes corresponding to the changes of the positions.

As illustrated in the drawing, the electronic component according to the present embodiment is provided with a nearly rectangular flat plate housing 11, a plurality (three in the example illustrated in the drawing) of elongated conductive terminal 51 loaded on the housing 11, and a conductive plate 61 as a pair of flat plate external conductive members loaded on both surfaces of the flat plate housing 11. For example, both ends of the central conductive terminal 51 are connected to a ground wire of the substrate, not illustrated; both ends of both sides of the conductive terminal 51 are each connected to a pair of differential signal wires of the substrate, whereby the electronic component 1 functions as a part of the differential signal circuit in the substrate, and the conductive plate 61 functions as an EMI shield member that electromagnetically effectively shields a part of the differential signal circuit. Furthermore, for example, both sides of the conductive terminal 51 may include a passive element such as a resistor element having a high electric resistance or an inductor having a high inductance; in such a case, the electronic component 1 functions as a passive component connected to the substrate.

As illustrated in FIG. 4, each conductive terminal 51 is an elongated belt-shaped member die-cut from a conductive metallic plate and integrally formed by carrying out processing such as folding, and includes a linearly extended main body 53, and a tail part 52 that is connected via a curved part 55 provided with a cross-section shape that is roughly clamp-shaped in the length direction of each end of the main body 53. The tail part 52 is in a position separated in the external direction from the width direction external surface of the housing 11. Furthermore, the lower surface of the tail part 52 is connected to the connection pad joined to the conductive wire of the substrate, not illustrated, by soldering and the like. By interposing the curved part 55, the main body 53 and both ends of the tail part 52 are substantially parallel to each other, but since the heights are different, even if the lower surface of the tail part 52 is fixed to the connecting pad of the surface of the substrate, the main body 53 will be separated further from the surface of the substrate. Note, if the curved part 55 is unnecessary, it can be omitted. Moreover, the portion near the center in the length direction of the main body 53 is composed of a capacitor 54 that functions as a capacitor member (capacitor) opposing the conductive plate 61. Note, the portion corresponding to the capacitor 54 in the central conductive terminal 51 is enlarged in the width direction, and the edge protrusion 63 of the conductive plate 61 is connected and composed of a conducting conductive plate connecting part 56. Since the conductive plate connecting part 56 conducts with the conductive plate 61, it does not function as the capacitor.

The housing 11 is a member integrally formed by an insulating material such as a synthetic resin, and as illustrated in FIG. 3, includes a nearly rectangular frame part 12 and a nearly rectangular flat plate part 13, the periphery of which is defined by the frame part 12. Note, the frame part 12 includes a pair of long frame parts 12a that oppose each other and a pair of short frame parts 12b to bind both ends of the long frame parts 12a. Furthermore, as illustrated in FIG. 5A, the up and down direction dimensions of the flat plate part 13, that is, the thickness, is made thinner than the thickness of the frame part 12, thus a difference in level exists between both the upper and lower surfaces of the flat plate part 13 and both the upper and lower surfaces of the frame part 12. Note, the magnitude of difference in the upper and lower levels is substantially the same.

Also, an intermediate level part 15 is formed as a protrusion extending along the short frame part 12b on each of the connecting portions of each short frame part 12b on both the upper and lower surfaces of the flat plate part 13. Both the upper and lower surfaces of the intermediate level part 15 function as conductive plate supporting surfaces to support both ends in the length direction of the conductive plate 61. Also, the magnitude of the difference in level between both upper and lower surfaces of the intermediate level part 15 and both upper and lower surfaces of the frame part 12 is substantially the same as the thickness of the conductive plate 61; the magnitude of the difference in level between both the upper and lower surfaces of the intermediate level part 15 and both the upper and lower surfaces of the flat plate part 13 is substantially the same size (thickness) of the gap 18 formed between the conductive plate 61 and the flat plate part 13.

The conductive terminal 51 is integrated with the housing 11 by various forming methods from over-molding to insert forming. That is, the housing 11 is formed by filling an insulating material into a metal cavity that first had a conductive terminal 51 set inside. Thereby, the conductive terminal 51, as illustrated in FIG. 2, has at least a portion embedded in the housing 11 and becomes integrated with the housing 11. Accordingly, the housing 11, in fact, is not formed as a single body as the shape illustrated in FIG. 3, but is formed to be integrated with the conductive terminal 51 as illustrated in FIG. 2. Also, both surfaces of both sides of the flat plate part 13 of the housing 11 and the portion of the conductive terminal 51 embedded in the flat plate part 13, that is, both surfaces of both sides of the capacitor 54 and the conductive plate connecting part 56 are substantially the same.

Note, in the example illustrated in FIG. 3, a capacitance housing part 14 that houses the capacitor 54 of the conductive terminal 51 and the conductive plate connecting part 56, and a connecting part housing part 16 are formed on the flat plate part 13; a portion of the flat plate part 13 of each conductive terminal 51 passes through and is housed in the long frame part 12a, and a terminal through hole 17 is formed therein. However, as stated before, the housing 11 is not formed as a single body as in the shape illustrated in FIG. 3. Accordingly, the capacitance housing part 14, the connecting part housing part 16, and the terminal through hole 17 are as illustrated in the drawings for convenience of description.

Each conductive plate 61 is a nearly rectangular flat plate shaped member composed of a conductive metallic plate, the external dimensions thereof being set slightly smaller than the internal dimensions of the frame part 12, thus being housed in the inner side of the frame part 12 of the housing 11 as illustrated in FIG. 1. Note, an edge protrusion 63 is formed on a surface opposing the flat plate part 13 of the housing 11 in each conductive plate 61, that is, on the inner surface 62, projecting towards the center thereof in the flat plate part 13 direction. Since the edge protrusion 63 contacts the conductive plate connecting part 56 of the central conductive terminal 51 and is a projection that conducts to the conductive connecting part 56, it is desirable for that protrusion (tip end part) to be a flat surface. Furthermore, in the example illustrated in the drawings, a recess 63a is formed in a position corresponding to the edge protrusion 63 on the surface of the opposite side of the inner surface 62 in the conductive plate 61, that is, on the outer surface; however, since the recess 63a occurs as a result formed by press forming the edge protrusion 63, it is possible for it to not exist when the forming method of the edge protrusion 63 is different.

Further, an insulator 21 is added in a position opposing the capacitor 54 of the conductive terminal 51 on both sides of the inner surface 62 of each conductive plate 61, so as to be a belt-like thin film that covers the inner surface 62 throughout the whole range of the width direction of the conductive plate 61. Furthermore, the flat surface part on the external surface in the length direction from the insulator 21, which is both end parts in the length direction on the inner surface 62 of each conductive plate 61, functions as the supported surface 64 supported by the intermediate level part 15 without the insulator 21. The insulator 21 is a member formed by an insulating material such as a synthetic resin, but while the dielectric constant is greater than that of the atmosphere, it is desirable for it to be as small as possible. Furthermore, the insulator 21 may, for example, be a thin film member or a film composed of an insulating material adhered to the inner surface 62 by an adhesive, but here it is described as a coating obtained by thinly and uniformly applying a paste-like insulating material to the inner surface 62.

Also, the conductive plate 61, as illustrated in FIG. 1, is housed in the inner side of the frame part 12, and is mounted on both surfaces of the housing 11. This causes, as illustrated in FIGS. 5A and 5B, the supported surface 64 positioned on both ends of the length direction of the conductive plate 61 to contact the surface of the intermediate level 15 of the housing 11, the protrusion of the edge protrusion 63 positioned in the center of the length direction of the conductive plate 61 to contact the surface of the conductive plate connecting part 56 of the conductive terminal 51 in the center, whereby the conductive plate 61 is supported by the housing 11 and the conductive terminal 51 that is integrally formed with the housing 11. Note, in order to reliably fix the conductive plate 61 with respect to the housing 11 and the conductive terminal 51, it is possible to, for example, interpose an adhesive between the supported surface 64 and the intermediate level part 15, and to interpose solder or a conductive adhesive between the protrusion of the edge protrusion 63 and the surface of the conductive plate connecting part 56.

When the mounting to both surfaces of the housing 11 of the conductive plate 61 is complete, as illustrated in FIGS. 5A and 5B, a gap 18 is formed between the surface of the flat plate 13 adjacent to the capacitor 54 of the conductive terminal 51 of both sides and the capacitor 54, and the inner surface 62 of the conductive plate 61. That is, the surface of the flat plate 13 adjacent to the capacitor 54 and the capacitor 54, and the inner surface 62 of the conductive plate 61 are separated without touching. Furthermore, a second gap 18a having dimensions in the up and down direction that are smaller (thickness is thinner) than the gap 18 is formed between the surface of the flat plate 13 adjacent to the capacitor 54 and the capacitor 54, and the surface of the insulator 21 added on the inner surface 62 of the conductive plate 61. That is, the surface of the flat plate 13 adjacent to the capacitor 54 and the capacitor 54, and the surface of the insulator 21 are separated without touching. Note, as described above, since the magnitude of the difference in level between both upper and lower surfaces of the intermediate level part 15 and both upper and lower surfaces of the frame part 12 is substantially the same as the thickness of the conductive plate 61, the surface of the frame part 12 and the external surface of the conductive plate 61 are substantially flush.

In this manner, the conductive plate 61 effectively functions as the shield of the conductive terminal 51 of both sides when the central conductive terminal 51 is connected to the grand line of the substrate since the edge protrusion 63 contacts the conductive connecting part 56 of the central conductive terminal 51 and conducts, and the inner surface 62 is separated from the capacitor 54 of the conductive terminal 51 of both sides.

Furthermore, since the size of the gap 18 formed between the conductive plate 61 and the capacitor 54 of the conductive terminal 51, that is, the distance between the conductive plate 61 and the capacitor 54, is defined by the intermediate level part 15 of the housing 11, a predetermined value can be stably maintained, even if, for example, it is minute. Accordingly, even if parasitic capacitance (stray capacitance) is generated between the conducting plate 61 and the capacitor 54, since the size of the parasitic capacitance would be constant, it would be easily handled.

Further, even if an unanticipated external force is added and the conductive plate 61 is displaced towards the capacitor 54, since the insulator 21 exists in a position opposing the capacitor 54 on the internal surface of the conductive plate 61, the conductive plate 61 will not contact the capacitor 54 and conduct. Accordingly, a short circuit between the central conductive terminal 51 and the conductive terminal 51 of both sides is reliably prevented.

Note, here only an example is described wherein there are three of the conductive terminal 51, but the number of the conductive terminal 51 is not limited to this, and it may be singular or a plurality, or it may be several.

In this manner, the electronic component 1 according to the present embodiment is provided with a housing 11, a conductive terminal 51 loaded onto to the housing 11, and a conductive plate 61 loaded onto the housing 11, wherein the gap 18 between the conductive plate 61 and the conductive terminal 51 is defined by the edge protrusion 63 formed by the intermediate level part 15 formed on the housing 11, or the conductive plate 61.

This allows the gap 18 to be reliably maintained to predetermined dimensions as the gap between the conductive plate 61 and the conductive terminal 51, even if the electronic component 1 is miniaturized, and since the capacitance between the conductive plate 61 and the conductive terminal 51 is constant, it is possible to reliably exhibit a desirable performance. Accordingly, it is possible to obtain an electronic component 1 having a high reliability, low manufacture cost, and high durability.

Furthermore, the housing 11 is a flat plate shaped member integrally formed with the conductive terminal 51, and the conductive plate 61 is loaded on both surfaces of the flat plate shaped housing 11. Accordingly, the positional relationship between the housing 11 and the conductive terminal 51, the positional relationship of mutual conductive terminals 51, and the positional relationship between the conductive terminal 51 and the conductive plate 61 can be stably maintained even if the electronic component 1 is miniaturized.

Further, a thin film-like insulator 21 is added to the inner surface 62 opposing the conductive terminal 51 on the conductive plate 61. Accordingly, even if an unanticipated external force is added and the conductive plate is displaced from facing the conductive terminal 51, the conductive plate 61 will not contact the conductive terminal 51 and conduct.

Further, a second gap 18a that is smaller than the gap 18 exists between the insulator 21 and the conductive terminal 51. In this manner, since an atmosphere with a smaller dielectric constant than the insulator 21 is interposed between the insulator 21 and the conductive terminal 51, it is possible to suppress the capacitance between the conductive plate 61 and the conductive terminal 51 to be lower than when the entire gap 18 is filled with the insulator 21.

Further, the housing 11 includes a flat plate 13 provided with a surface that is substantially flush with the surface of the conductive terminal 51, and an intermediate level part 15 that protrudes from the surface of the flat plate 13 and is formed on both ends of the flat plate 13, wherein the conductive plate 61 includes a supported surface 64 that positions both ends, wherein the supported surface 64 contacts both surfaces of the intermediate level part 15, whereby the gap 18 is defined. Accordingly, even if the electronic component 1 is miniaturized, it is possible to reliably maintain the gap 18 to predetermined dimensions.

Accordingly, when there is a plurality of the conductive terminal 51, a protrusion 63 that contacts the surface of at least one conductive terminal 51 and conducts is included, whereby the gap 18 is defined. Accordingly, it is possibly to more reliably maintain the gap 18 to predetermined dimensions.

Further, the housing 11 includes a flat plate 13 provided with a surface that is substantially flush with the surface of the conductive terminal 51, and a frame part 12 that is thicker than the flat plate 13, which is the frame part 12 that defines the periphery of the flat plate 13, wherein the external surface of the conductive plate 61 loaded on the housing 11 is substantially flush with the surface of the frame part 12. Accordingly, the surface of the electronic component 1 is a smooth surface with few irregularities, and operations such as suction with a vacuum suction nozzle are simple.

Next a second embodiment will be described. Note, the description of objects having the same structure as the first embodiment will be omitted by being denoted by the same reference numerals. Furthermore, the description of operations and effects that are the same as the first embodiment will be omitted.

Figure 6:
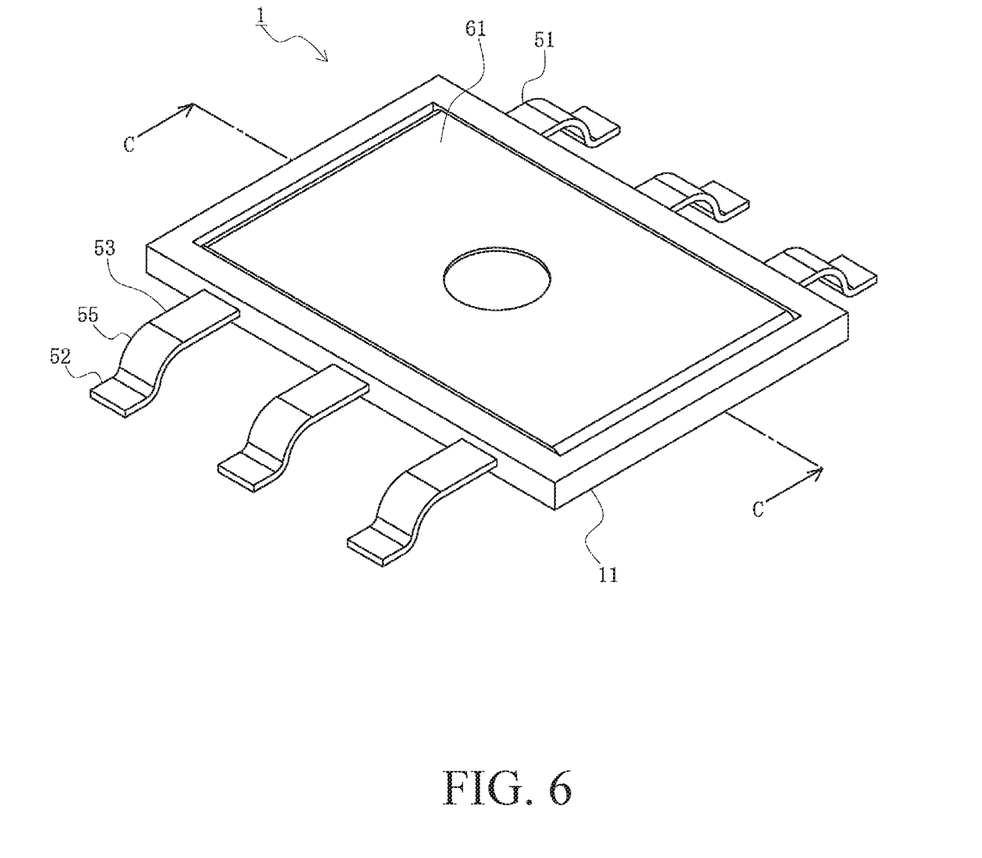
FIG. 6 is a perspective view illustrating the electronic component according to the second embodiment.
Figure 7:
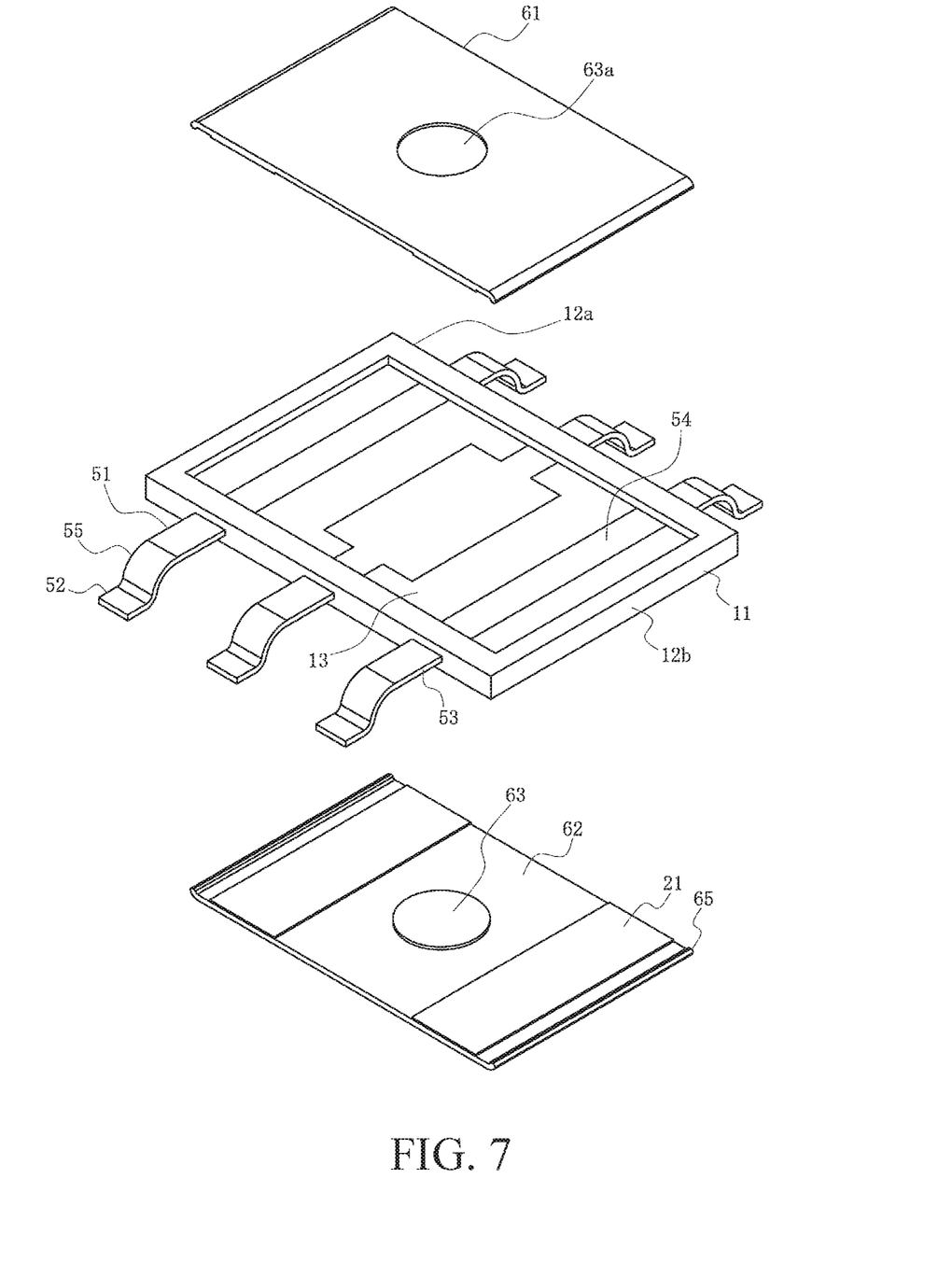
FIG. 7 is an exploded view of the electronic component according to the second embodiment.
Figure 8:
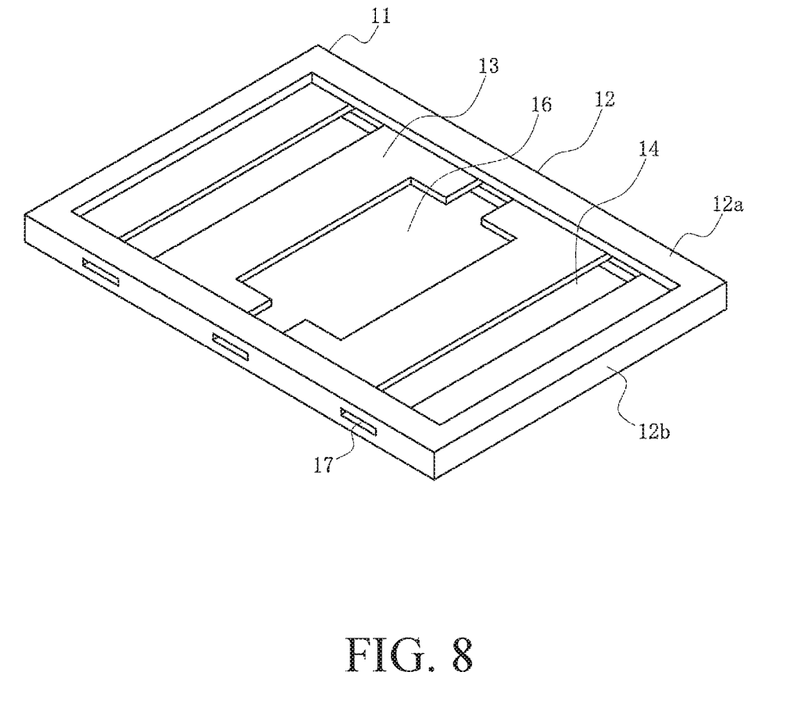
FIG. 8 is a perspective view illustrating the housing according to the second embodiment.
Figure 9A:
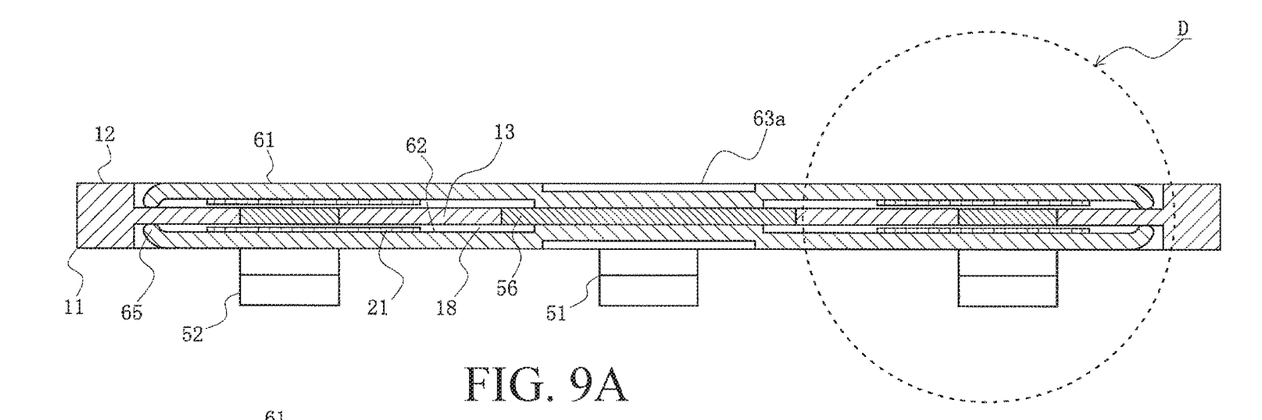
FIG. 9A is cross-sectional view along the C-C line in FIG. 6.
Figure 9B:
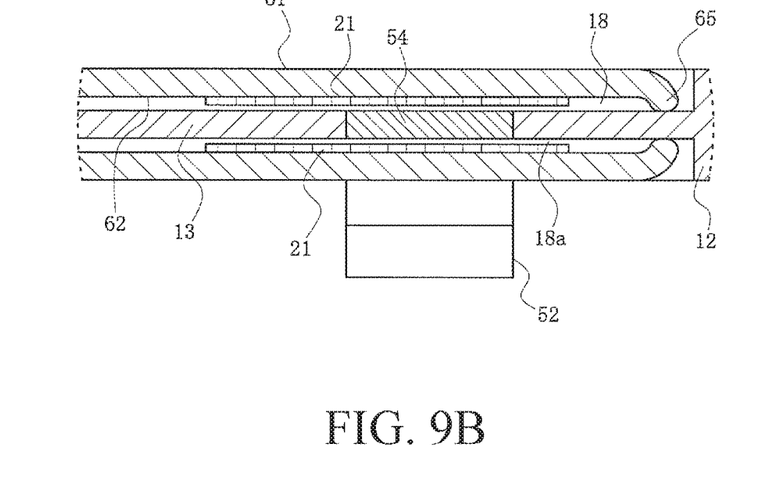
FIG. 9B is an enlarged view of portion D in FIG. 9A.

FIG. 6 is a perspective view illustrating an electronic component according to the second embodiment, FIG. 7 is an exploded view of an electronic component according to the second embodiment, FIG. 8 is a perspective view illustrating a housing according to the second embodiment, and FIGS. 9A and 9B are cross-sectional views of the electronic component according to the second embodiment. Note, FIG. 9A is a cross sectional view along the C-C line in FIG. 6, and FIG. 9B is an enlarged view of the D part in FIG. 9A.

In the first embodiment, an intermediate level part 15 is formed extending along the short frame part 12b on the connecting portion of each short frame part 12b on both upper and lower surfaces on the flat plate 13 of the housing 11. In contrast to this, in the present embodiment, an intermediate level part 15 is not formed on the flat plate 13 of the housing 11, and the connecting portion of each short frame part 12b on both upper and lower surfaces of the flat plate 13 are flat, and are substantially flush with other portions.

Furthermore, in the first embodiment, the portion on the external surface in the length direction from the insulator 21 on the inner surface 62 of the conductive plate 61 is flat so as to function as the supported surface 64 that is supported by the intermediate level part 15. In contrast to this, in the present embodiment, both ends in the length direction of the conductive plate 61 curve towards the direction of the inner surface 62, and become the edge protrusion 65 that protrude from the inner surface 62. The edge protrusion 65 is a protrusion that extends throughout the whole range of the width direction of the conductive plate 61, is positioned on the external side in the length direction from the insulator 21, and the tip surface thereof contacts the flat connecting portion of each short frame part 12b on both upper and lower surfaces of the flat plate 13. Furthermore, the distance from the external surface of the conductive plate 61 to the tip of the edge protrusion 65 is substantially the same as the distance between both upper and lower surfaces of the flat plate 13 and both upper and lower surfaces of the frame part 12.

Also, as illustrated in FIG. 6, when the conductive plate 61 is housed on the inner side of the frame part 12 and mounted on both surfaces of the housing 11, then, as illustrated in FIGS. 9A and 9B, the tips of the edge protrusion 65 formed on both ends in the length direction of the conductive plate 61 contact the flat connecting portion of each short framed portion 12b on both upper and lower surfaces of the flat plate 13 of the housing 11. This allows both ends in the length direction of the conductive plate 61 to be supported by the flat plate 13 of the housing 11. Note, in order to reliably fix the conductive plate 61 with respect to the housing 11, it is possible to, for example, interpose an adhesive between the tip of the edge protrusion 65 and both upper and lower surfaces of the flat plate 13.

Note, since the other points of the configuration are the same as the first embodiment, the descriptions thereof are omitted.

In this manner, in the electronic component 1 according to the present embodiment, the housing 11 includes a flat plate part 13 that is flush with both ends and other portions, which is the flat plate part 13 provided with a surface that is substantially flush with the surface of the conductive terminal 51, wherein the conductive plate 61 includes an edge protrusion 65 formed on both ends, and the edge protrusion 65 contacts both ends of the flat plate part 13, whereby the gap 18 is defined. Accordingly, even if the electronic component 1 is miniaturized, it is possible to reliably maintain the gap 18 to predetermined dimensions.

Note that the disclosure of the present specification describes characteristics related to preferred and exemplary embodiments. Various other embodiments, modifications, and variations within the scope and spirit of the claims appended hereto could naturally be conceived by persons skilled in the art by summarizing the disclosures of the present specification.

The present disclosure can be applied to an electronic component.

What is claimed is:

1. An electronic component, comprising:
   a housing;
   a conductive terminal loaded on the housing;
   an external conductive member loaded on the housing; and
   a thin film-like insulator provided on a surface of the external conductive member facing the conductive terminal,
   wherein a first gap between the external conductive member and the conductive terminal is defined by a protrusion formed on the housing or the external conductive member, and wherein a second gap smaller than the first gap exists between the insulator and the conductive terminal.

2. The electronic component according to claim 1, wherein the housing is a flat plate member integrally formed with the conductive terminal, and the external conductive member is loaded on both an upper side of the housing and a lower side of the housing.

3. The electronic component according to claim 1, wherein the housing comprises a flat plate part having first and second opposite ends, wherein the external conductive member comprises a flat surface part disposed on the ends, wherein a surface of the flat plate part is substantially flush with the flat surface part of the conductive terminal, wherein the housing further comprises a protrusion formed on both ends of the flat plate part protruding from the surface of the flat plate part, and wherein the flat surface part contacts a surface of the protrusion, whereby the first gap is defined.

4. The electronic component according to claim 1, wherein the conductive terminal is provided in plurality, and wherein the external conductive member comprises a protrusion that conducts by contacting a surface of at least one conductive terminal, whereby the first gap is defined.

5. The electronic component according to claim 1, wherein the housing comprises a flat plate part provided on a surface substantially flush with a surface of the conductive terminal, and a frame part thicker than the flat plate part, which is a frame part that defines a periphery of the flat plate part, and wherein an external surface of the external conductive member loaded on the housing is substantially flush with a surface of the frame part.

6. An electronic component, comprising:
   a housing comprising a flat plate part having first and second opposite ends;
   a conductive terminal loaded on the housing;
   an external conductive member loaded on the housing, the external conductive member comprises a flat surface part disposed on the ends,
   wherein a surface of the flat plate part is substantially flush with the flat surface part of the conductive terminal,
   wherein the housing further comprises a protrusion formed on both ends of the flat plate part protruding from the surface of the flat plate part, and
   wherein the flat surface part contacts a surface of the protrusion, whereby a gap is defined.

7. An electronic component, comprising:
   a housing;
   a conductive terminal loaded on the housing;
   an external conductive member loaded on the housing; and
   wherein the housing comprises a flat plate part provided on a surface substantially flush with a surface of the conductive terminal, wherein the housing further comprises a frame part thicker than the flat plate part, which is a frame part that defines a periphery of the flat plate part, wherein an external surface of the external conductive member loaded on the housing is substantially flush with a surface of the frame part, and wherein a gap between the external conductive member and the conductive terminal is defined by a protrusion formed on the housing or the external conductive member.

8. An electronic component configured to be mounted onto an outer surface of a substrate, the electronic component comprising:
   a housing having a frame part and a plate part, the plate part having a periphery which is defined by the frame part, the frame part having upper and lower surfaces which define a thickness of the frame part, the plate part having upper and lower surfaces which define a thickness of the plate part, the upper and lower surfaces of the plate part being positioned between the upper and lower surfaces of the frame part such that the thickness of the frame part is greater than the thickness of the plate part, the plate part having an opening provided therethrough;
   a conductive terminal loaded on the housing, the conductive terminal having a main body which is housed within the opening of the plate part, the conductive terminal further having a tail part which is external to the housing and which is configured to be positioned on the outer surface of the substrate; and a conductive plate loaded on the housing, at least a portion of the conductive plate being generally positioned such that a lower surface thereof is separated from the upper surface of the plate portion and the conductive terminal such that a gap is formed therebetween.

9. The electrical component as defined in claim 8, wherein an upper surface of the conductive plate is generally flush with the upper surface of the frame part.

10. The electrical component as defined in claim 8, wherein an insulator is provided on the lower surface of the conductive plate such that a second gap, which is smaller than the gap, is provided between the insulator and the upper surface of the plate portion and the conductive terminal.

11. The electrical component as defined in claim 8, wherein the conductive terminal is a first conductive terminal, and wherein the opening provided through the plate part is a first opening, the plate part further having a second opening provided therethrough, the electrical component further comprising a second conductive terminal loaded on the housing, the second conductive terminal having a main body which is housed within the second opening of the plate part, the second conductive terminal further having a tail part which is external to the housing and which is configured to be positioned on the outer surface of the substrate.

12. The electrical component as defined in claim 11, wherein a center portion of a length direction of the main body of the first conductive terminal is composed of a capacitor that functions as capacitor member opposing the conductive plate.

13. The electrical component as defined in claim 11, wherein the conductive plate has an edge protrusion which projects toward a center portion of the main body of the second conductive terminal and has a lower surface which contacts the center portion of the main body of the second conductive terminal.

14. The electrical component as defined in claim 13, wherein the center portion of the main body of the second conductive terminal is enlarged in a width direction as compared to a center portion of the main body of the first conductive terminal.

15. The electrical component as defined in claim 14, wherein an upper surface of the edge protrusion defines a recess relative to the upper surface of a remainder of the conductive plate.

16. The electrical component as defined in claim 8, wherein the conductive plate is an upper conductive plate and wherein the gap is an upper gap, and further comprising a lower conductive plate, at least a portion of the lower conductive plate being generally positioned such that an upper surface thereof is separated from the lower surface of the plate portion and the conductive terminal such that a lower gap is formed therebetween.

17. The electrical component as defined in claim 16, wherein an upper surface of the upper conductive plate is generally flush with the upper surface of the frame part, and wherein a lower surface of the lower conductive plate is generally flush with the lower surface of the frame part.

18. The electrical component as defined in claim 16, wherein an upper insulator is provided on the lower surface of the upper conductive plate such that an upper second gap, which is smaller than the upper gap, is provided between the upper insulator and the upper surface of the plate portion and the conductive terminal, and wherein a lower insulator is provided on the upper surface of the lower conductive plate such that a lower second gap, which is smaller than the lower gap, is provided between the lower insulator and the lower surface of the plate portion and the conductive terminal.

19. The electrical component as defined in claim 16, wherein the conductive terminal is a first conductive terminal, and wherein the opening provided through the plate part is a first opening, the plate part further having a second opening provided therethrough, the electrical component further comprising a second conductive terminal loaded on the housing, the second conductive terminal having a main body which is housed within the second opening of the plate part, the second conductive terminal further having a tail part which is external to the housing and which is configured to be positioned on the outer surface of the substrate.

20. The electrical component as defined in claim 19, wherein a center portion of a length direction of the main body of the first conductive terminal is composed of a capacitor that functions as capacitor member opposing the conductive plate.

21. The electrical component as defined in claim 19, wherein the upper conductive plate has an edge protrusion which projects toward a center portion of the main body of the second conductive terminal and has a lower surface which contacts the center portion of the main body of the second conductive terminal, and wherein the lower conductive plate has an edge protrusion which projects toward the center portion of the main body of the second conductive terminal and has an upper surface which contacts the center portion of the main body of the second conductive terminal.

22. The electrical component as defined in claim 21, wherein the center portion of the main body of the second conductive terminal is enlarged in a width direction as compared to a center portion of the main body of the first conductive terminal.

23. The electrical component as defined in claim 22, wherein an upper surface of the edge protrusion of the upper conductive plate defines a recess relative to the upper surface of a remainder of the upper conductive plate, and wherein a lower surface of the edge protrusion of the lower conductive plate defines a recess relative to the lower surface of a remainder of the lower conductive plate.

* * * * *